US006940189B2

United States Patent
Gizara

(10) Patent No.: US 6,940,189 B2
(45) Date of Patent: Sep. 6, 2005

(54) SYSTEM AND METHOD FOR INTEGRATING A DIGITAL CORE WITH A SWITCH MODE POWER SUPPLY

(76) Inventor: Andrew Roman Gizara, 24471 Corta Cresta Dr., Lake Forest, CA (US) 92630-3914

(*) Notice: Subject to any disclaimer, the term of this patent is extended or adjusted under 35 U.S.C. 154(b) by 52 days.

(21) Appl. No.: 10/604,573

(22) Filed: Jul. 31, 2003

(65) Prior Publication Data

US 2005/0024908 A1 Feb. 3, 2005

(51) Int. Cl.[7] .............................. G06F 1/26
(52) U.S. Cl. .................. 307/151; 713/322; 323/283
(58) Field of Search ..................... 323/274, 273, 323/281, 283; 307/151; 713/300, 320, 322

(56) References Cited

U.S. PATENT DOCUMENTS

| | | | | |
|---|---|---|---|---|
| 5,132,606 A | * | 7/1992 | Herbert | 323/266 |
| 5,570,276 A | * | 10/1996 | Cuk et al. | 323/266 |
| 6,683,767 B2 | * | 1/2004 | Ito et al. | 361/56 |
| 6,781,353 B2 | * | 8/2004 | Rozsypal | 323/224 |

* cited by examiner

Primary Examiner—Shawn Riley

(57) ABSTRACT

A digital core embodied within a semiconductor die that requires plural separate power supply voltage domains is situated within any of a variety of integrated circuit packaging technologies. Within the integrated circuit package including this semiconductor die also exists a switch mode DC-to-DC voltage converter, preferably a synchronous step-down regulator powering the entire integrated circuit from one supply voltage. The components contained within the integrated circuit package along with the semiconductor die include the switch mode power supply's power switching transistors, inductor core and windings, digital open-loop output voltage fixing circuitry, output capacitors and substrate for mounting said components when integrated within a packaging technology that does not already include a substrate.

19 Claims, 4 Drawing Sheets

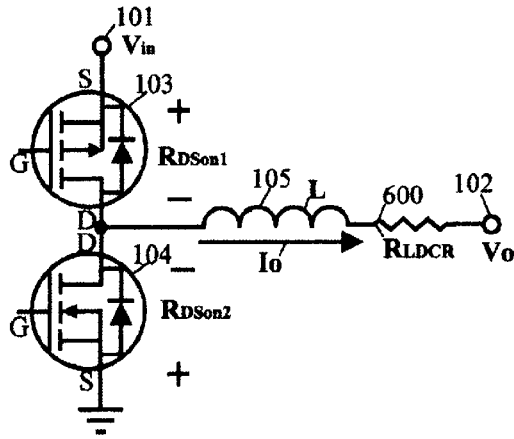
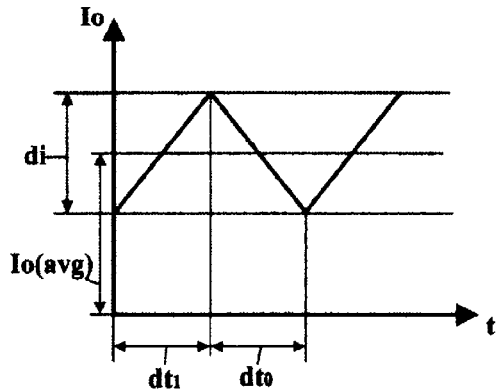

Kirchhoff's Voltage Law, 103 on, 104 off (dt1):

$$0 = V_{in} - I_o(R_{DSon1} + R_{LDCR}) - L\frac{di}{dt_1} - V_o$$

$$\therefore V_o = V_{in} - I_o(R_{DSon1} + R_{LDCR}) - L\frac{di}{dt_1}$$

$$\therefore di = \frac{dt_1}{L}(V_{in} - V_o - I_o(R_{DSon1} + R_{LDCR})) \quad \text{602}$$

Kirchhoff's Voltage Law, 103 off, 104 on (dt0):

$$0 = L\frac{di}{dt_0} - I_o(R_{DSon2} + R_{LDCR}) - V_o$$

$$\therefore V_o = L\frac{di}{dt_0} - I_o(R_{DSon2} + R_{LDCR})$$

$$\therefore L\frac{di}{dt_0} = V_o + I_o(R_{DSon2} + R_{LDCR})$$

*Choose L, Fs such that di < 2(Io(min)) for continuous mode operation, (for this analysis to apply)*

$$\therefore V_o = V_{in} - I_o(R_{DSon1} + R_{LDCR}) - L\frac{di}{dt_1} = L\frac{di}{dt_0} - I_o(R_{DSon2} + R_{LDCR})$$

$$V_{in} = Ldi\left(\frac{1}{dt_1} + \frac{1}{dt_0}\right) + I_o(R_{DSon1} - R_{DSon2}) \quad SwitchingFrequency \equiv F_s = 1/(dt_1 + dt_0)$$

$$V_{in} = Ldi\left(\frac{dt_0 + dt_1}{dt_1(dt_0)}\right) + I_o(R_{DSon1} - R_{DSon2}) \quad DutyCycle \equiv \delta = dt_1(F_s) \therefore dt_1 = \delta/F_s$$

$$V_{in} = L\frac{di}{dt_0}\left(\frac{1}{\delta}\right) + I_o(R_{DSon1} - R_{DSon2}) \therefore L\frac{di}{dt_0} = \delta(V_{in} - I_o(R_{DSon1} - R_{DSon2}))$$

$$L\frac{di}{dt_0} = \delta(V_{in} - I_o(R_{DSon1} - R_{DSon2})) = V_o + I_o(R_{DSon2} + R_{LDCR}) \quad \text{601}$$

$$\therefore V_o = \delta(V_{in} - I_o(R_{DSon1} - R_{DSon2})) - I_o(R_{DSon2} + R_{LDCR})$$

FIG. 6

SYSTEM AND METHOD FOR INTEGRATING A DIGITAL CORE WITH A SWITCH MODE POWER SUPPLY

BACKGROUND OF INVENTION

1. Field of the Invention

The present invention is generally in the field of semiconductor circuits. More specifically, the present invention is in the field of semiconductor die packaging with integrated power supply voltage regulation.

2. Background Art

Advances in semiconductor integrated circuit fabrication processes and digital standard cell and semi-custom application specific integrated circuit, "ASIC", design methodologies have given rise to digital and mixed analog and digital signal integrated circuits requiring separate power supplies for various parts including a unique voltage for the digital core power supply, and a second, unique power supply voltage for the input/output pad ring, and possibly a third power supply voltage for miscellaneous analog functions. While this advancement brings the advantage of reduced core power consumption as a product of one-half the total gate capacitances times the gate voltages squared times the switching frequency, there arises the problem of regulation of these additional voltages. With the advent of system-on-chip technologies, designers of these devices have only begun to address this requirement for regulating multiple power supply domains on-chip. Given prior art, it often finally remains the responsibility of the top-level system integrator to provide this variety of power supply voltage domains at the board level and not chip level, obscuring the costs of the total solution implementing the prior art system-on-chip. Often both the system-on-chip designer and the top-level integrator, not having the time, resources, or background of experience in power supply design tend to choose simple-to-implement, but less than optimal linear voltage regulation cores or devices to provide these plural voltage domains from a single supply voltage. When implemented using a linear voltage regulation device, a substantial amount of the power savings realized by accepting a lower core voltage is lost in the form heat dissipated through the linear regulator's transistors, by design. The overall solution cost and power consumption may actually rise if this heat dissipated in the linear voltage regulator is great enough to require additional components to provide forced air convection cooling. Also, the system-on-chip itself could require additional heat-sinking components or else suffer reduced reliability due to the implementation of a linear voltage regulator on-chip, thereby driving-up hidden costs of the total solution.

Therefore, there exists a need for a novel and reliable system and method to provide power to multiple voltage domains of semiconductor dies to overcome the problems faced by conventional semiconductor die packages integrating a linear voltage regulation power supply. More specifically, there exists a need for a novel and reliable system and method to optimally provide power to multiple voltage domains within semiconductor dies while reducing overall system cost, power consumption, and heat dissipation.

SUMMARY OF INVENTION

The present invention is directed to a system and method for integrating a semiconductor die of plural power supply voltage domains with a switch mode DC-to-DC converter in an integrated circuit package. The invention discloses a system and a method to design and fabricate such an integrated circuit system in a single package to obtain optimal power savings, and minimal heat dissipation and cost. According to one embodiment, a semiconductor die is situated within the periphery of a lead frame adjacent to the switch mode power supply substrate. The substrate can comprise, for example, a ceramic material, or most economically, a fiberglass resin epoxy based laminate material such as FR4. In one embodiment, the semiconductor die is situated on the substrate adjacent to the integrated switch mode DC-to-DC converter. In one embodiment, a semiconductor die may receive power for its lower voltage supply pads through any DC-to-DC converter of the switch mode step-down variety in a closed-loop general solution implementation.

In the preferred embodiment, the present invention provides a superior means for optimally converting voltages to the correct domains for semiconductor die operation through synchronous step-down conversion. Furthermore, the present invention's substantial departure from prior art and significant novelty exists in the preferred embodiment wherein said switch mode synchronous DC-to-DC step-down converter is implemented in an open-loop configuration retaining precision based on semiconductor die power consumption characterization data, thus achieving the lowest possible cost for total solution of the system-on-chip.

BRIEF DESCRIPTION OF DRAWINGS

FIG. 6 illustrates a schematic view of a physical model of the power switching circuit, a graph of electrical current flow through it over time, and the mathematical derivation of its governing design equations.

DETAILED DESCRIPTION

The present invention is directed to a system and method for integrating a semiconductor die of plural power supply voltage domains with a switch mode DC-to-DC converter in an integrated circuit package. The following description contains specific information pertaining to various embodiments and implementations of the invention. One skilled in the art will recognize that the present invention may be practiced in a manner different from that specifically depicted in the present specification. Furthermore, some of the specific details of the invention are not described in order not to obscure the invention. The specific details not described in the present specification are within the knowledge of a person of ordinary skills in the art. Obviously, some features of the present invention may be omitted or only partially implemented and remain well within the scope and spirit of the present invention.

The following drawings and their accompanying detailed description are directed as merely exemplary and not restrictive embodiments of the invention. To maintain brevity, other embodiments of the invention that use the principles of the present invention are not specifically described in the present specification and are not specifically illustrated by the present drawings.

Figure 1:
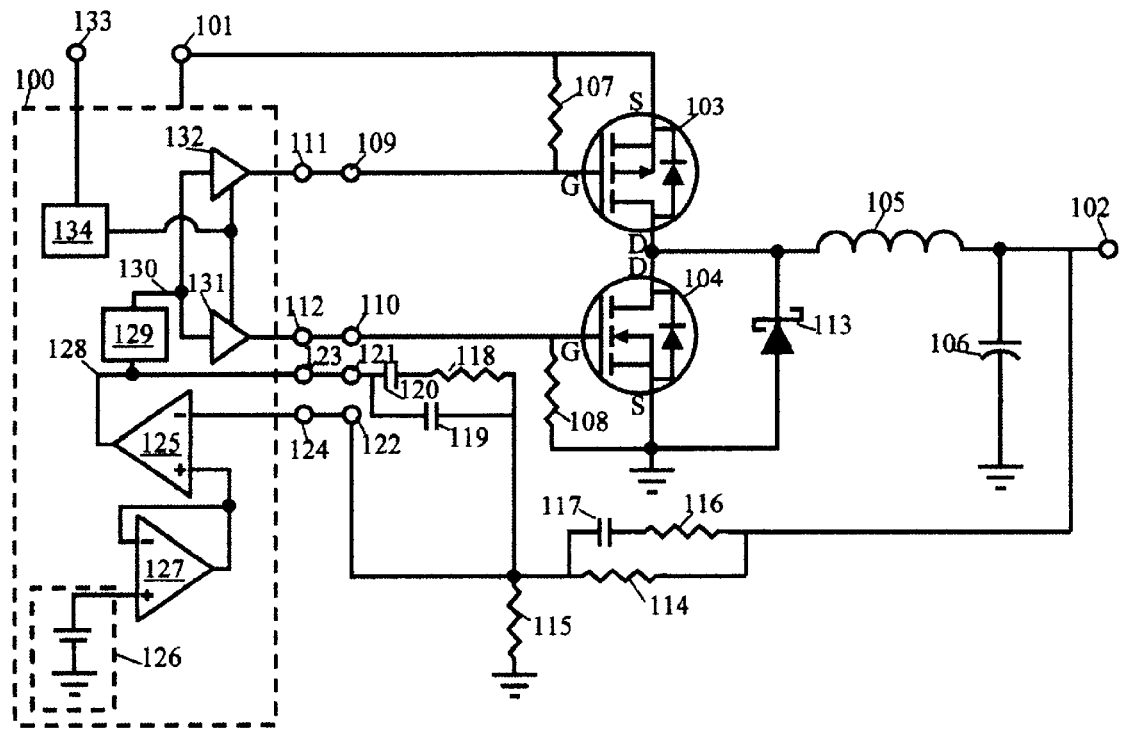
FIG. 1 illustrates a schematic view and wiring diagram of an exemplary structure in accordance with one embodiment of the present invention.

FIG. 1 illustrates a schematic and block wiring diagram of one embodiment of the present invention. Block 100 represents the semiconductor die. The semiconductor die 100 may embody any of a variety of functions that may be implemented using digital standard cell or semi-custom Application Specific Integrated Circuit "ASIC", analog or analog and digital mixed signal design methodologies, any of such implementation in said semiconductor die 100 wherein the die itself requires plural unique voltage domains for powering its circuitry. An exemplary embodiment within the semiconductor die 100 could be a digital core that performs any of a variety of tasks including generic microprocessor tasks, digital signal processing or media stream specific compression or encoding or decompression or decoding, whereby the core of the semiconductor die 100 is powered at a lower voltage 102 than its input/output pad ring 101. In the preferred embodiment given in this specification in only an exemplary and not restrictive manner, this input/output pad ring voltage 101, would be that commonly employed in prior art systems, 3.3 Volts, whereas the core voltage 102 would be 1.8 Volts, that presently commonly employed in 0.18 micron lithographic process geometry based silicon Complementary Metal Oxide Semiconductors, "CMOS", a well-characterized, mature technology utilizing standard cell library based design methodologies. While trends indicate that researchers are presently pioneering process geometries as small as 90 nanometers that entail further reductions in core voltage to below 1 Volt, this specification directly exemplifies the mainstream process technology in use today and subsequently shows how the present invention scales well and furthermore, becomes more advantageous as process geometries reduce and further require reduced core voltages with respect to input/output voltages. This inherent design advantage of the present invention only becomes more apparent as lower core voltages are more readily adopted than lower system-wide input/output supply voltages.

The inherent advantage of the present invention exists due to the fundamental improved efficiency that a switch mode power supply, and especially a synchronous switched mode power supply has over the linearly regulated power supply of prior art. For instance, the field effect transistors 103, 104 and mostly the inductor 105 make up the voltage drop from the input voltage 101 to the output voltage 102 during the charging phase of the inductor 105. With the availability of very low on resistance field effect transistors and the loss of the inductor 105 mostly due to the DC resistance of its copper windings which is typically relatively low, most of the energy contained in the voltage dropped across the charging inductor is delivered during the inductor discharging phase of the switching cycle allowing this design to often achieve efficiencies greater than ninety percent. In contrast, by design, a linear voltage regulator drops all of the difference voltage between its input and output voltages across an internal transistor, which burns off the energy in the form of heat, and therefore can never exceed a power efficiency greater than the ratio of its output voltage to is input voltage, not to mention the adverse affects of the voltage regulator's heat by-product on the life expectancy and performance of the semiconductor die. In a traditional, non-synchronous step-down regulator, Schottky diode 113 exists in lieu of bottom transistor 104. While reducing the lost power required to drive the gate of the bottom transistor 104, because the forward voltage drop across the Schottky diode 113 is typically greater than the drain-to-source voltage across transistor 104, the efficiency of a traditional step-down regulator is generally 5% to 20% less than a synchronous step-down converter. Although this specification subsequently offers a thorough mathematical analysis of the operation of a synchronous switch mode step-down DC-to-DC converter, let it now be stated that obviously transistors 103 and 104 operate in opposite phase with respect to each other, and great care is always necessarily taken in the design of the gate drivers 131, 132 to never allow the on periods of these two transistors to coincide, to prevent what is commonly referred to as "shoot-through" current, an effective short circuit from the input voltage 101 to ground. Since the phase of the switching cycle that transistor 103 is on charges inductor 105, then turning off transistor 103 creates a negative change in current with respect to time, di/dt<0, this causes the voltage across inductor 105 which equals Ldi/dt to reverse, and thus deliver this reversed electromotive force, or "reverse EMF", into the output voltage node 102 as either the now forward-biased Schottky diode 113 or transistor 104 in the on state in this phase references the formerly positive, now negative voltage node of inductor 105 to near ground level. Implementing both Schottky diode 113 and transistor 104 allows improved efficiency as the low forward voltage drop of the Schottky diode 113 references the discharging phase negative node of inductor 115 to ground after transistor 103 turns off but before transistor 104 turns on, with ample delay to prevent shoot-through current. Let it be known that any combination of components implemented whether transistor 104 or Schottky diode 113 or both, does not constitute a substantial departure beyond the scope of the present invention.

The following components comprise the feedback loop common to nearly all existing step-down switch mode power supplies and therefore could constitute any implementation within the scope of the present invention although such a traditional feedback loop does not comprise the output voltage fixing circuit found in the preferred embodiment practiced within the preferred method of the present invention. All the discrete components external to the semiconductor die 100 including resistors 114, 115, 116, 118, capacitors 117, 119, 120, and substrate bonding pads 121, 122, and the components internal to the semiconductor die 100 including the bonding pads 123, 124, the band-gap voltage reference 126, the reference voltage buffer 127, and the error amplifier 125 of FIG. 1, and the voltage comparator 200 depicted in FIG. 2 within the pulse width modulation controller 129, exist in a feedback loop in common practice of prior art switch mode DC-to-DC converters, but this feedback loop does not exist in the output voltage fixing circuit found in the preferred embodiment practiced within the preferred method of the present invention. Nonetheless, since the circuitry of the prior art feedback loop does not constitute a substantial departure beyond the scope of the present invention, its use will hereinafter be briefly described.

The two resistors 114 and 115 form a voltage divider that allows arbitrary setting of the output voltage 102 given the fixed internal reference voltage presented at the output of the reference voltage buffer 127 into the error amplifier 125. This output voltage 102 can then be arbitrarily fixed to any value given by the reference voltage multiplied by the quantity of one plus the ratio of resistor 114 over resistor 115. Resistors 116 and 118 and capacitors 117, 119, 120 form the frequency compensation of the error amplifier 125 within the feedback loop of the traditional switch mode power supply. While tuning these frequency compensation components is not germane to the specification of the present invention and is elsewhere covered in greater detail, this specification will now disclose some general observations regarding it. Uncompensated, the inductor 105 and the output capacitor 106 produce a complex pole pair at their resonant frequency given by one over the quantity of two times π times the square root of inductance times the capacitance. The output capacitor 106 also places a zero above the pair of poles at a frequency given by one over the quantity of two times π times the capacitance and the value of the capacitor's 106 equivalent series resistance, "ESR". Generally as a goal in compensation, two zeroes are added near the filter resonant frequency to correct the sharp change in phase near that frequency and an open-loop unity gain frequency is chosen to exist at a frequency about ten times greater than the resonant frequency but less than about 10% of the switching frequency. The overall gain of the error amplifier 125, the filter components comprising the inductor 105 and output capacitor 106, the two zeroes added plus the gain of the integrator in the compensation network that sets open-loop unity gain frequency should sum to zero at the unity gain frequency. The integrator gain is given by $1/(2\pi (F_o)(R114(C119+C120)))$ where $F_o$ is the open-loop unity gain frequency. The frequency of the output filter compensating zeroes equals $1/(2\pi(R118)(C120))$ and $1/(2\pi(R114+R116)(C117))$ and these zeroes are understood to add to 40 dB per decade of gain. A pole also exists in the compensation network and its frequency is chosen to coincide with the zero formed by the output capacitor 106 and its equivalent series resistance "ESR". This compensating pole frequency equals $1/(2\pi(R116)(C117))$. A final pole in the compensation network exists at the frequency $1/(2\pi(R118)(C119\|C120))$ and is selected to be about $\frac{3}{4}F_s$, three-quarters of the switching frequency to reduce switching noise into the comparator 200. While it is understood the precise placement of the pole frequencies, integrator frequency and zeroes frequencies is not of utmost criticality, care must still be taken to follow the aforementioned feedback loop frequency compensation practices to give best power supply response and stability over widely varying loads. In the past, stability problems have risen due to substituting the output capacitor 106 such as with the choice of a ceramic capacitor of very low ESR to replace a capacitor of differing material and construction incurring higher ESR, thus the compensation network no longer providing proper phase margin and causing the instability. In the preferred embodiment not only is this dilemma avoided, furthermore by not including such feedback and compensation network and preferably including a very low ESR ceramic output capacitor 106, it achieves efficiency improvement, lowest output voltage ripple, and space savings. The frequency compensated feedback loop provides a general solution where load is not well characterized, or effectively a system to control a stochastic process. Obviously, the addition of components 114 through 127 and component 200 adds significant cost to an integrated circuit. The components mounted on the power supply substrate have obvious tangible cost, but also the analog components internal to the semiconductor die 100 add expense in terms of process precision requirements resulting in lower yield compared to an implementation of strictly digital standard cell library components. Therefore subsequently this specification presents a novel preferred embodiment and method of design and manufacture wherein the cost of a frequency compensated feedback loop is avoided by characterizing the power requirements of the semiconductor die 100 and thus simplifying the system to a deterministic input model.

One motivation in using such a frequency compensated feedback loop aside from its field proven robustness to a widely varying load, is that often in digital cores and especially mixed signal cores, there may already exist a band-gap voltage reference 126 for any of a variety of analog functions, or in the former case of a digital core, for use in a phase-lock loop analog macro cell whereby the digital core is clocked at a much higher rate than is driven by, although derived from, the external clock source. While an integrated circuit product of long life or high unit volume expectancy would lose significant profit by incurring the cost of the components needed for a frequency compensated feedback loop versus the preferred embodiment and method, if the semiconductor die 100 already contains a band-gap reference 126 and the cost of fully characterizing the power states of the semiconductor die in terms of time-to-market of a short-lived product outweighs the additional cost of the frequency compensated feedback loop and additional reference voltage buffers 127, error amplifier 125 and comparator 200, then the traditional switch mode power supply solution may be desirable.

Figure 2:
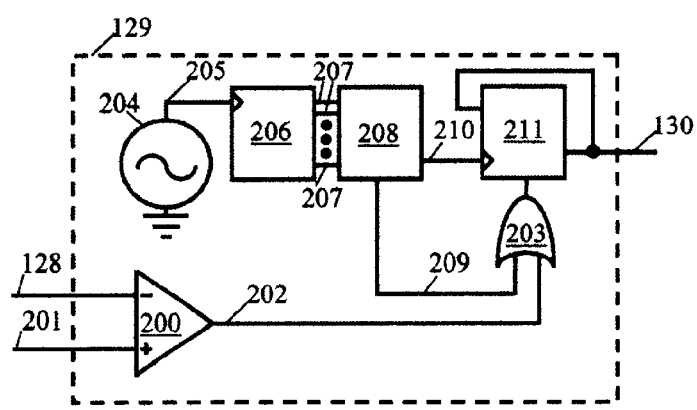
FIG. 2 illustrates a block diagram of the pulse width modulation controller in FIG. 1 according to one embodiment of the present invention.
Figure 3:
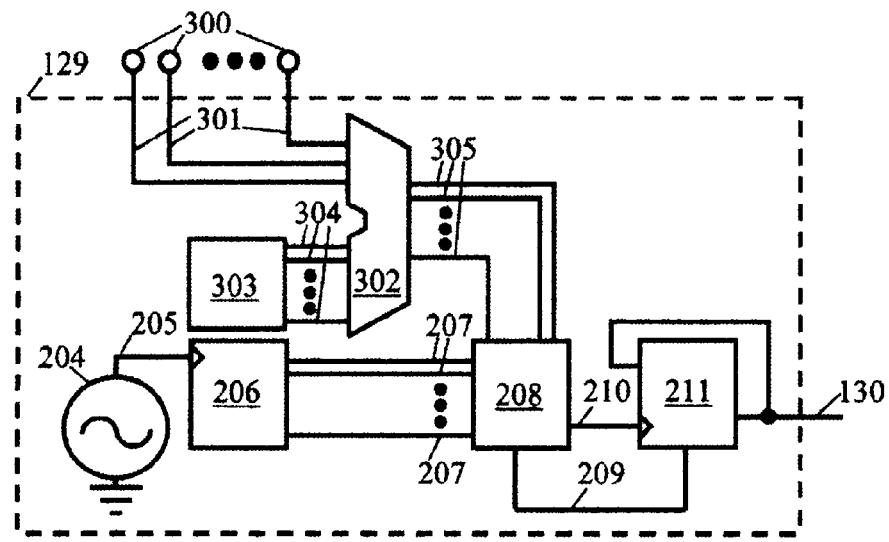
FIG. 3 illustrates a block diagram of the pulse width modulation controller in FIG. 1 according to the preferred embodiment of the present invention.

The remaining components in FIG. 1 include the pulse width modulation or pulse frequency modulation controller 129 which will be further delineated in subsequent paragraphs and in FIG. 2 and FIG. 3, the output 130 of the modulation controller 129 that feeds the gate drivers 131, 132 and the related power-up sequencing and under voltage lock out logic 134 and associated components. As shown for logical clarity, a single output 130 of the modulation controller 129 inputs to both gate drivers 131, 132. As previously mentioned, the gate drivers 131, 132 must be designed with consideration given to the turn-on and turn-off delay of the power switching field effect transistors 103, 104 such that the two transistors 103, 104 are never on simultaneously. This may be accomplished in the preferred embodiment by providing through, preferably but not necessarily, synchronous means, a delay of one gate driver turning its transistor off for approximately 40 nanoseconds before the other gate driver turns on its transistor. Therefore the output 130 of the modulation controller 129 may actually comprise both logic and synchronization signals or exist as two differing signals of similar phase only delaying the rising edge into driver 131 and delaying the falling edge into driver 132. Another consideration for these gate drivers 131, 132 is the switching frequency $F_s$ and thus the total current that driving the total gate charge of transistors 103, 104 requires at this frequency, preferably obtainable by implementing a 12-to-16 milliamp or less driver output pad cell common to most standard cell libraries. A thorough analysis of the gate drivers 131, 132 will be disclosed along with the exemplary power supply components commercially available for the preferred embodiment subsequently with the description of FIG. 6 and the derivation of the governing design equations. Block 134 represents the logic employed in power-up sequencing and under voltage lock out functions. Pad 133 would likely be implemented as a low true reset input that an external power supervisor module outputs conditionally from monitoring the input/output ring voltage 101. On power-up, upon arriving at a satisfactory voltage level for a prescribed period of time, the external supervisor brings the reset signal on pad 133 to an inactive state. As shown in FIG. 1, if the reset signal is low true the logic block 134 may simply route this directly to the positive true output enable inputs of the gate drivers 131, 132. Ultimately the logic block 134 is also responsible for proper power-up and power-down sequencing of the other internal functional blocks of the semiconductor die 100, including the internal clocking circuitry and thus the pulse width modulation or frequency modulation block 129, and this may be achieved by simply giving proper delay to the input reset signal from pad 133 before routing to other remaining functional blocks within the semiconductor die 100. As such, under voltage lock out is essentially the function provided by the external power supervisor circuit, the result is identical regardless of power-up or power-down. When the reset signal 133 is active due to under voltage of the input/output pad ring voltage 101, the gate drivers 131, 132 are placed into high impedance state, and the resistors 107, 108 bring the power switching transistors 103, 104 into an innocuous off state.

While portrayed in FIG. 1 as external resistors 107, 108, the same exact functionality may be obtained through the use of two 10-to-100 microampere current sources configured as default weak pull-up and weak pull-down, respectively, standard cell output pads internal to the semiconductor die 100.

FIG. 2 illustrates a block diagram of the pulse width modulation controller 129 for implementation within the aforementioned frequency compensated feedback loop. The analog comparator 200 receives at its inverting input, the voltage signal output 128 from the error amplifier 125. The non-inverting input 201 of the analog comparator 200 receives a DC voltage signal equal to that of the voltage reference 126, in the same manner as the error amplifier 125, through a unique instance of a voltage follower, separate but equal to that of the voltage buffer 127. In this manner as stated previously, the single instance of the voltage reference 126 may serve a plurality of functions, including but not limited to also an analog phase-lock loop for internal clocking of a digital core, through a plurality of unique instances of voltage buffers equivalent to buffer 127. Thus the analog comparator 200 compares the inverted output 128 of the error amplifier 125 to a DC reference voltage 126. Since the comparator 200 itself is also configured as an inverting amplifier referenced to the band-gap voltage reference 126, the power supply output voltage 102 once divided by resistors 114, 115 gets inverted through the error amplifier 125, and its output 128 gets inverted by the comparator 200, thus the comparator output 202 is a logic high signal when the output voltage 102 is above the set voltage and the comparator output 202 is a logic low signal when the output voltage 102 is below the set voltage. This comparator output 202 logic signal is routed out through an Or gate 203 to a common D flip-flop 211 into its positive true asynchronous reset input. Thus when the output voltage 102 exceeds the set voltage, the D flip-flop 211 is asynchronously reset and its inverted output 130, also the output of the modulation controller 129 and inputs to both gate drivers 131, 132, goes high, disabling the top power switching transistor 103. Routing this comparator output 202 to the asynchronous reset input of the D flip-flop 211 permits the controller 129 to operate in an energy saving "pulse skip" mode. When the output voltage 102 exceeds the set voltage, the energy needed to charge and discharge the power switching transistor gates is saved.

The pulse frequency portion of the controller 129 depicted in FIG. 2 begins with the clock circuit 204. This clock may be the buffered input of a clock source external to the semiconductor die 100, or an output of an internal clock generation circuit such as a phase-lock loop. The output 205 of this clock circuit then feeds a frequency dividing clock counter 206. This counter 206 may either count up to a terminal value or count down from an initial value that divides the clock output 205 down to the power supply switching frequency, $F_s$, in the range of 100 KHz to 2 MHz, and in the preferred embodiment, approximately 1 MHz during peak load current. The counter 206 outputs count values on bus 207 to a decoder 208. In the implementation employing a frequency compensated feed back loop, this decoder 208 strictly decodes the states prior to the counter roll-over and outputs a rising edge signal 210 to clock the D flip-flop 211 upon each roll-over of the counter 206 at the power supply switching frequency, $F_s$, and also outputs a pulse signal 209 that goes active high then inactive low one clock 205 state prior to the roll-over of counter 206, through an Or gate 203 into the asynchronous reset input of the D flip-flop 211. The pulse signal 209 thus affects the D flip-flop 211 to go into a reset state just prior to the end of the period defined by the power supply switching frequency, $F_s$, and because the D flip-flop 211 is configured with its inverted output 130 feeding back to its D input, the D flip-flop 211 then toggles upon receiving a clock pulse 210. As long as the analog comparator output 202 is not causing a pulse skipping constant asynchronous reset state of D flip-flop 211, this guarantees the output 130 causes gate driver 132 to drive power switching transistor 103 active at the beginning of the period defined by the power supply switching frequency, $F_s$, with a maximum duty cycle defined by the number of count values counted on bus 207 minus one divided by the total number of count values counted on bus 207.

FIG. 3 illustrates a block diagram of the pulse width or frequency modulation controller 129 for implementation within the preferred embodiment of the present invention. As before, the output 205 of clock circuit 204 feeds a counter 206 that derives the power supply switching frequency, $F_s$, and duty cycle through decoder 208, with D flip-flop 211 responding exactly as before to signals 209 and 210 to form the output 130 that feeds the gate drivers 131, 132. The difference in the controller 129 of the preferred embodiment compared to the previously described implementation employing the frequency compensated feedback loop, is the absence of the Or gate 203 including the output 202 of the comparator 200 for asynchronously resetting the D flip-flop 211, and also the addition of alternative output voltage fixing circuitry. This preferred embodiment of the pulse width or frequency modulation controller 129 achieves the significant cost-saving goal of eliminating all power supply related analog components internal to the semiconductor die 100, the voltage buffers 127, the error amplifier 125, and the analog comparator 200, through the use of what may be implemented with all digital standard cell library components. Instead of feeding back an error voltage signal through a comparator 200 to fix the output voltage 102, by characterizing the semiconductor die 100 current consumption over process variations and operating environment temperatures in all power states knowing its fixed input and output supply voltages 101, 102, values for power supply duty cycle and/or switching frequency $F_s$, relative to various supply current states may be implemented in decode logic configurations, or stored in registers or memory locations as depicted by block 303 in FIG. 3, and thus fix the power supply output voltage 102 precisely. The theory behind and method for implementing this innovation is described in subsequent paragraphs referencing FIG. 6. Therefore in the preferred embodiment, the operation of decoder 208 is slightly modified with respect to producing the duty cycle controlling pulse signal 209. Decoder 208 in the preferred embodiment now compares the frequency dividing clock count on bus 207 to a value on bus 305 that represents a duty cycle value corresponding to the present power state of the semiconductor die 100, theoretically calculated then empirically verified through probe testing the power supply substrate, that obtains the correct output voltage 102 by resetting D flip-flop 211 by asserting pulse signal 209 at the correct time. In one embodiment within the scope of the present invention, the values corresponding to various power states contained within block 303 may be encoded within the logic of decoder 208. In alternate embodiments within the scope of the present invention, block 303 may be a non-volatile memory device external to the semiconductor die 100, with values programmed after characterization of the semiconductor die 100 and after probe testing the power supply substrate, that get downloaded into register space within semiconductor die 100 during reset. In yet another alternate embodiment within the scope of the present invention, block 303 may store values corresponding to the power supply switching frequency, $F_s$, while also varying or keeping fixed the duty cycle to obtain the correct output voltage 102 by decoding values on bus 207 within decoder 208 and outputting signals 209 and 210 appropriately.

Between the output bus 304 of block 303 and bus 305 into decoder 208 in FIG. 3 exists an arithmetic logic unit 302 that takes binary offset values from pads 300 input onto bus 301 and either adds these to or subtracts these from the values stored in block 303 output on bus 304 before inputting the sum or difference into decoder 208 from bus 305. The hypothetical use of this offset is that in some embodiments of the present invention, the values stored in block 303 overestimate the theoretical losses in the power supply components and once verified empirically by probe testing the power supply substrate at various output current levels, the precise output voltage 102 is obtained by reducing the duty cycle and/or switching frequency, $F_s$, by the amount represented by the offset value, the binary number input on pads 300. If the frequency divider clock counter 206 counts up, the arithmetic logic unit 302 subtracts the value on bus 301 from the value on bus 304, and conversely, if counter 206 counts down, the arithmetic logic unit 302 adds the value on bus 301 to the value on bus 304, in order to reduce the duty cycle or switching frequency, $F_s$, to obtain the empirically tested precise output voltage 102. The binary number offset input on pads 300 may be implemented in any of the following ways. The pads 300 may be optionally bonded to the input voltage 101 or ground rail or pads of a lead frame or die mounting substrate, with a default internal weak pull-down or pull-up embodied within the pad 300. In another embodiment of the present invention the pads 300 may be bonded to a substrate and the binary number offset may be encoded by breaking fusible leads on the substrate either through mechanical or electrical or laser-trimming means during integrated circuit assembly, as before with a default internal weak pull-down or pull-up embodied within the pad 300. Let it be known that minor deviations or omissions, partial or complete non-implementation of this offset adjusting mechanism does not constitute a substantial departure beyond the scope of the present invention.

Figure 4:
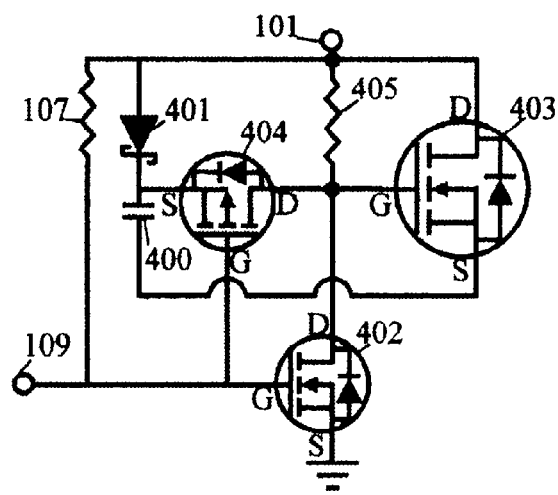
FIG. 4 illustrates a schematic view of a switching transistor gate charge pump circuit according to one embodiment of the present invention.

FIG. 4 depicts a switching transistor gate charge pump circuit generally implemented to improve the efficiency of the power switching circuit. In FIG. 4, the N-channel enhancement mode field effect transistor 403 replaces the P-channel enhancement mode field effect transistor 103 in FIG. 1. While the circuit of FIG. 4 costs an additional five small components, the advantages include a lower current gate driver 132; economy of scale cost reduction by now ordering twice as many N-channel switching transistors 403, 104; and for equivalent structures with equal gate-to-source voltage magnitudes and total gate charges applied, N-Channel devices tend to have a drain-to-source on resistance of about sixty percent of that of P-Channel devices, due in part to electron mobility being greater than hole mobility in silicon. As shown, when in the inactive state, transistor 402 is on, turning off power switching transistor 403, transistor 404 is off and capacitor 400 is charging up to the input voltage 101 minus the sum of forward voltage drop of the Schottky diode 401 and the drain-to-source voltage of the transistor 104 not shown. When in the active state, transistor 403 turns on by transistor 402 turning off, allowing the gate of transistor 403 to first charge through resistor 405, then as transistor 404 turns on, the gate of transistor 403 rises above the input voltage 101 by approximately the voltage stored across capacitor 400, bringing the transistor 403 to a very low on resistance state. Resistor 107 functions exactly as it did in FIG. 1, holding the circuit in an innocuous state when driver 132 is in a high impedance state. This charge pump circuit is portrayed strictly in an exemplary and not restrictive manner, therefore any other circuit achieving the same results does not constitute a substantial departure from the scope of the present invention.

Figure 5:
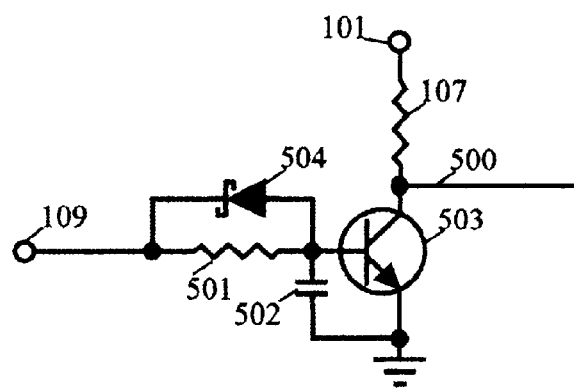
FIG. 5 illustrates a schematic view of a trimmed delay circuit for fine-tuning the duty cycle according to one embodiment of the present invention.

FIG. 5 illustrates a trimmed delay circuit for fine-tuning the duty cycle of the power switching transistor 103. While this circuit necessitates the addition of four or five more components, the advantages include a reduced current gate driver 132; and when the addition of bonding pads 300 incur greater expense in semiconductor die area than the cost of the additional components, the elimination of bonding pads 300 needed to set a binary number offset for lowering the theoretical duty cycle on the semiconductor die 100. The circuit of FIG. 5 shortens the duty cycle by providing an asymmetrical delay, by delaying the turn-on, but not the turn-off of power switching transistor 103, attached by its gate lead to the lead 500. Bipolar NPN transistor 503 goes into saturation when adequate current flowing into its base reaches a voltage of between 0.65 to 0.7 Volts. In order for the base of transistor 503 to arrive at the saturation voltage, capacitor 502 must charge through resistor 501 fed from the voltage present on substrate bonding pad 109, delivered by the gate driver 132. This voltage on substrate bonding pad 109 is approximately equal to the input/output pad ring voltage 101, referred to in equations as $V_{in}$ hereinafter. Therefore according to the first-order linear model for charging capacitors, the on period of the power switching transistor 103 is reduced by a maximum of—(R501)(C502) In(1−0.7/$V_{in}$) seconds and a minimum of—(R501)(C502)In(1−0.65/$V_{in}$) seconds. The turn-off of power switching transistor 103 is not significantly delayed because Schottky diode 504 quickly follows the voltage of substrate bonding pad 109 as it drops, immediately discharging capacitor 502 to no more than the Schottky diode 504 forward voltage, well below the saturation voltage of transistor 503. By including transistor 503 in the path of the gate driver signal, the polarity of the gate of power switching transistor 103 is now effectively inverted. Therefore to implement this circuit compared to the previously described embodiments, the gate driver 132 should now invert its input signal 130 prior to outputting the signal from die bonding pad 111 onto substrate bonding pad 109. Resistor 107 must exist external to the semiconductor die 100 in this embodiment, which may or may not have been implemented as such in previously described embodiments, and must now provide current in the order of tens of milliamps to avail the appropriate gate charging times for the desired switching frequency, $F_s$, instead of microamperes of holding current as previously described.

As with the binary number offset pads 300, the hypothetical use of the delay circuit of FIG. 5 is that in some embodiments of the present invention, the values stored in block 303 overestimate the theoretical losses in the power supply components and once verified empirically by probe testing the power supply substrate at various output current levels, the precise output voltage 102 is obtained by reducing the duty cycle by a percentage equal to the amount of time of the delay multiplied by the switching frequency, $F_s$. While the amount of delay time has an accuracy of approximately +/−20% depending upon component tolerances, the total amount of duty cycle error, and thus output voltage 102 error, is ultimately reduced to ordinarily less than 2% since the total delay itself is a small fraction of the total duty cycle. The manufacturer of the integrated circuit may employ any of at least two methods of trimming this delay. Insertion of a 1% tolerance surface mount resistor 501 on the power supply substrate may occur after the aforementioned probe test through a selective pick-and-place program, or preferably, resistor 501 may exist as a printed film resistor on the power supply substrate prior to the aforementioned probe test and trimmed by laser to set the desired output voltage 102. Laser trimming works especially well because not only may the manufacturer perform this simultaneous to probe testing, but also as previously discussed, the theoretical duty cycle may be estimated at a level greater than practical, and printed resistors, while being trimmed increase in resistance. Therefore the trimming of the resistor 501 by laser while simultaneously probe testing, raises its resistance, which increases the time delay of switching on the power transistor 103, which shortens the duty cycle, thus converging from above to the precise output voltage 102 most expeditiously.

One other advantage of the circuit in FIG. 5 is it avails the integrated circuit designer flexibility in choice of power switching transistor 103 and in design of the gate driver 132. With implementing the delay circuit of FIG. 5 on the power supply substrate, the designer may accommodate large variability in two parameters otherwise affecting design of the gate driver 132, the turn-on delay and total gate capacitance of the power switching transistor 103, after the semiconductor die 100 has been designed and fabricated.

FIG. 6 illustrates a schematic view of a physical model of the power switching circuit including losses, a graph of the output current versus time, and the mathematical derivation of the equations that govern the design of the system. The mathematical derivation begins with a time domain piece-wise linear analysis applying Kirchhoff's Voltage Law for the two phases of when the top transistor 103 is on charging the inductor 105, and then when the bottom transistor 104 is on referencing the inductor 105 to ground as it discharges. This approach affords two independent equations from which to derive an expression for the output voltage 102, hereinafter referred to as $V_o$, as a function of the input voltage 101, $V_{in}$; the duty cycle, δ, lower case delta; the theoretical losses, namely the DC resistance of the inductor 105 coil, $R_{LDCR}$ 600, and the drain-to-source on resistances of the switching transistors 103, 104, $R_{DSon1}$ and $R_{DSon2}$ respectively; and the average output current, hereinafter referred to as $I_o$. Note that $I_o$ is a sum of the average current demanded by the semiconductor die 100, and the peak-to-peak inductor 105 ripple current, referred to as di. It is known that CMOS digital devices require current mostly during switching and the instantaneous current demand can appear as a pseudo random pattern, so therefore the semiconductor die 100 supply current may be thought of as a statistical average of random instantaneous currents. This statistical average works well as voltage regulation is the ultimate goal and the output capacitor 106, especially one of very low ESR delivers instantaneous peak currents as needed to provide a constant average voltage with little noise and ripple voltage. This analysis yields extremely accurate results providing adherence to the criterion of continuous mode of operation, assuming the turn-on and turn-off delays of the switching transistors necessary to prevent shoot-through current do not represent a significant portion of the switching period, $1/F_s$. The criterion of continuous mode operation may be explained qualitatively by stating that as long as current continually flows through the inductor 105, the system behaves in continuous mode; or may be described graphically and thus derived mathematically, by noting that if the trough of inductor ripple current sawtooth waveform, di, dips to the x-axis, its lower limit, then operation becomes discontinuous, or in other words, the lower half of the ripple current, di/2, must be less then the average output current, in mathematical terms, $di<2I_{o(avg.)}$ for continuous mode operation. Since the mathematical derivation depicted in FIG. 6 meticulously indicates all algebraic manipulations performed in arriving at the governing equations, one skilled in the art needs no description of this treatment to appear here in the text of this specification. Block 601 shows the result of the analysis, $V_o$ as a function of $V_{in}$, duty cycle, $I_o$, and losses. Block 602 shows a representation of peak-to-peak inductor ripple current, di, as a function of transistor 103 on-time, dt 1; inductance L, $V_{in}$, $V_o$,$I_o$ and top transistor 103 drain-to-source on resistance, $R_{DSon1}$, and Inductor coil DC resistance 600, $R_{LDCR}$. The equation in block 601 and its derivation verifies the assertion of the fundamental theoretical principle of the present invention, namely, given fixed input and output voltages 101, 102, and having characterization data defining all supply current states $I_o$, with empirical data or even reasonably accurate estimates stating the component losses, one may digitally fix the duty cycle of a high efficiency synchronous switch mode power supply in an open loop configuration and still obtain a precise output voltage 102 while eliminating the expense of the frequency compensated feedback loop and especially the precision analog circuits internal to the semiconductor die 100.

A brief description of a design method followed by a practical design example including commercially available switch mode power supply parts will further illustrate the above stated theoretical assertion. The preferred design and fabrication method comprises the following design method that applies to the preferred embodiment and therefore any other embodiments within the scope of the present invention may entail certain deviations to the following method that also remain within the scope of the present invention. Upon completing the design of the core within the semiconductor die 100, the integrated circuit designer has available power consumption estimates per clocking rates and ambient temperature and process variations, from the integrated circuit design automation tools. From this point the designer may fix certain system parameters such as acceptable system clocking rates, thus defining clock source parameters, and from here arrange the number of power states along with the actual power consumed by the semiconductor die 100 in each of these states. Given this data, the designer may complete the top-level design of the semiconductor die 100, including designing the power supply components comprising the gate drivers 131, 132; the power-up sequencing and under voltage lock out logic 134 along with its interaction with the clock circuit 204; and the entire pulse width or frequency modulation controller 129 while defining the configuration of and values contained within the duty cycle or frequency table 303. Referring to the equation within block 601 within FIG. 6, the designer may estimate the desired duty cycle or switching frequency, $F_s$, which are interchangeable due to their direct proportionality as shown elsewhere in FIG. 6, by manipulating the equation within block 601 solving for duty cycle as a function of $V_{in}$, $V_o$, $I_o$, and the loss components from the physical model. Next in the design procedure, after determining such parameters as the frequency of the clock source 204, duty cycles per $I_o$ states and especially the lowest current state $I_{o(min.)}$, the designer may now select inductance values L, and switching frequencies, $F_s$, as dictated by the equation given in block 602 and the continuous mode criterion. Note at this point that parameters of the switching transistors 103, 104, total gate capacitance and turn-on and turn-off delay, also affect both the choice of switching frequency, $F_s$, and design of the gate drivers 131, 132. The accuracy of the applied duty cycle values determine the precision of $V_o$, and obviously the accuracy of the dependent variables affect the calculation of these duty cycle values. $V_{in}$ is likely regulated to within 2% of its ideal value, and $I_o$ often calculated as a worst case, overestimated by up to 20%. As shown in block 601, the error voltage dependent on $I_o$ is also a product of the loss components which generally the designer can estimate from graphs such as drain-to-source on resistance versus gate-to-source voltage and drain-to-source on resistance versus drain current plus the DC coil resistance given as a maximum value in inductor or inductor core vendors' datasheets, resulting in a resistance in the range of 100 hundred milliohms and is of such proportions as to reduce the affect of the $I_o$ estimation error. This yields a total $I_o$ current dependent error voltage ordinarily less than two tenths of a Volt for most semiconductor die, which often is within the supply voltage tolerance. Nevertheless, the preferred method prescribes performing a physical characterization of the semiconductor die 100, empirically determining $I_o$ per clocking rates and ambient temperature and process variations; and also a probe test of the power supply substrate at different duty cycles and load currents corresponding to the various $I_o$ states to determine $V_o$ at each of these states, perhaps in a statistical sampling manner during production, but certainly during prototyping of the power supply substrate. The integrated circuit manufacturer should consider the last steps during manufacture, i.e. probe testing the power supply substrate at various output currents, $I_o$, to determine the extent of trimming the voltage fixing circuit, preferably when the estimated or empirically found total $I_o$ current dependent error voltage represents a significant portion of the $V_{in}$ supply voltage tolerance. If the total estimated $I_o$ current dependent error voltage does not represent a significant portion of the $V_{in}$ supply voltage tolerance, then not only these last steps in manufacturing may be skipped, the entire aforementioned output voltage offset adjusting circuits of FIG. 3 or FIG. 5 may be foregone for additional savings in the manufacture of the semiconductor die 100, or the power supply substrate itself.

The discussion now turns to a brief design example including selection of commercially available power supply components. This design example represents one of many configurations within the scope of the present invention and should be viewed as exemplary, not restrictive. For instance, this design example utilizes off-the-shelf transistors in their available packages, whereas using devices purchased through a known-good-die program and installed on the power supply substrate using chip-on-board technology would improve the use of power supply substrate area, but not substantially deviate beyond the scope of the present invention. In this example, a digital core has been designed that performs the function of a microprocessor that operates in three different power states, high speed, low speed, and idle, from a single external clock source or internal crystal oscillator specified to generate a 25 MHz input clock. The semiconductor die that embodies this microprocessor is fabricated in 0.18 micron CMOS technology and requires a 1.8 Volt +/-10% core voltage and a 3.3 Volt input/output ring voltage The design automation tool estimated the supply current drawn from the core voltage supply pads at 1 Ampere in high speed operation, 500 mA in low speed, and 100 mA in idle. First the designer chooses the power switching transistors 103, 104 primarily based on the criterion of having a very low drain-to-source on resistance given the approximate 3.3 Volt gate-to-source voltage that may be driven from the pads 111, 112 of the semiconductor die 100, with its 3.3 Volt input/output pad ring voltage. The designer chooses the Si5513DC available from the manufacturer Vishay Siliconix. The reasons for choosing this very small package of dual complementary transistors include its low drain-to-source resistance at a gate-to-source voltage magnitude of 3.3 Volts at a drain current of 1 Ampere, approximately 85 milliohms for the N-channel Field Effect Transistor 104, and 150 milliohms for the P-channel Field Effect Transistor 103; its relatively low typical total gate charge of around 4 nano-coulombs at a gate-to-source voltage of 3.3 Volts which a standard cell 16 mA gate driver 131, 132 can easily sink and source current for a switching frequency of up to 2 MHz; and relatively fast turn-on and turn-off delays of no worse than 40 nS. Other transistors exist with better drain-to-source on resistances at that magnitude of gate-to-source voltage which would improve the power efficiency, but the trade-off would be higher total gate capacitance which may warrant larger gate drivers 131, 132; longer delay times which would increase the output voltage error; and the Si5513DC is packaged in a single unit of the standard form factor of the Electronic Industries Alliance, "EIA", 1206 package where the others are in separate packages, doubling the area required on the power supply substrate. From this point, the designer may now determine the design of the gate drivers 131, 132, and set a nominal switching frequency, $F_s$, of 1 MHz, which implies the frequency divider clock counter 206 should count up from 0 to the count 24 if directly fed from the clock source 204 generating a 25 MHz clock. Now the designer, referring to block 601 of FIG. 6, also may determine the values stored in block 303 for use by the decoder 208 equate to 14, the fifteenth state of clock counter 206, for a duty cycle of 59.5% with less than 1% error for the microprocessor in high speed; 13, the fourteenth state of clock counter 206, for a duty cycle of 57.0% with 1.8% error for the microprocessor in low speed; and 13 for a duty cycle of 55.0% with 1.8% error for the microprocessor in idle. These count values represent the full on-time for transistor 103, and the turn-on and turn-off delays of the transistors may be accommodated by turning on transistor 104 one clock 204 state later, and off one clock 204 state earlier, while its body diode would continue to reference the reverse EMF of inductor 105 to ground during these delay periods. Since the values within block 303 adequately compensate such that 20% overestimation error of both $I_o$ current and loss components values can cause only about 4% output voltage error, but since the error due to the turn-on and turn-off delays of the transistors 103, 104 equate to about 2.4% and magnetic core loss could make an additional 2% of output voltage error, both in the opposite direction, the designer may forego implementing any of the aforementioned output voltage error offset adjusting circuits as depicted in FIGS. 3 or 5, for this example design. Otherwise, because the switching frequency, $F_s$, is derived directly from a clock that runs at twenty fives times $F_s$, the duty cycle granularity is 4% and therefore the offset adjusting circuit of FIG. 5 would be better at reducing the total output voltage error below 4% compared to that of FIG. 3. Knowing the $I_{o(min.)}$ value allows the designer to calculate the limit for maximum inductor ripple current, di, dictated by the continuous mode criterion then determine the minimum inductance by manipulating the equation in block 602 of FIG. 6, solving for L. In this design example, this calculation yields a value of 4.1 micro Henries for L. A value of 4.7 micro Henries is chosen for L and the inductor core manufacturer of choice, Micrometals, Inc., can provide the toroid core, the lowest cost part number T20-52, that after winding with 18 turns of 28 gauge solid copper wire can sustain this inductance at 1 Ampere and about 5.6 micro Henries at 100 mA, with a DC resistance of 37 milliohms in a package that sits at 0.1 inches height and 0.228 inches outside diameter. This enables continuous mode operation of the switch mode power supply down to currents typically as low as 73 mA. With increasing the switching frequency, $F_s$, continuous mode operation is guaranteed down to an output current inversely proportionally lower, although as stated before, increasing $F_s$ causes more power to be consumed in the gate drivers 131, 132. At twice the switching frequency, $2F_s$ (nominal), this exemplary circuit remains continuous for a semiconductor die 100 drawing as little as 36 mA, but the gate drivers 131, 132 alone consume an amount of power equal to a core voltage 102 drawing 30 mA, thus diminishing the savings of such an idle state. The only remaining component that the designer needs to specify now is the output capacitor 106 which preferably may be implemented with a 10 micro Farad ceramic capacitor of X5R temperature coefficient dielectric material presently available also in the EIA 1206 package type. This type of capacitor typically has an ESR of a few tens of milliohms and thus the ripple voltage, a product of the ripple current multiplied by this capacitor's ESR, will be less than 5 milliVolts. Therefore this exemplary circuit integrating a digital core with a high efficiency switch mode voltage regulator comprising a semiconductor die and three low profile packages could fit well within the confines of many packaging technologies, especially the presently popular Ball Grid Array or the Plastic Quad Flat Pack standard form factors of the Joint Electron Device Engineering Council.

Figure 7:
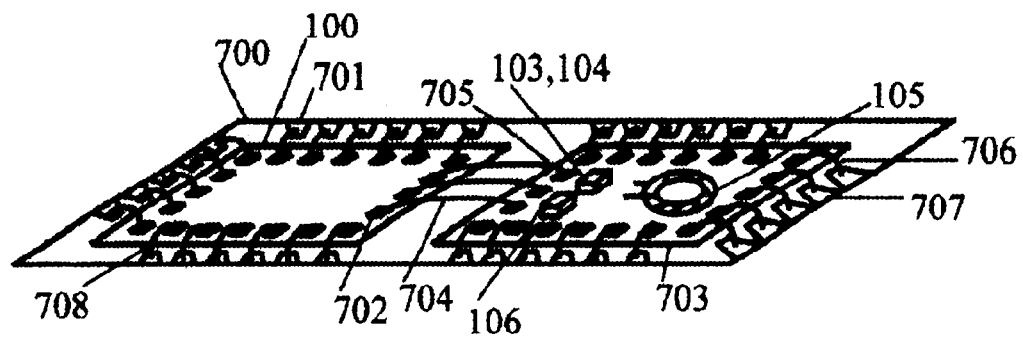
FIG. 7 illustrates a perspective view of the complete semiconductor die and power supply system integrated by bonding within the periphery of a lead frame.
Figure 8:
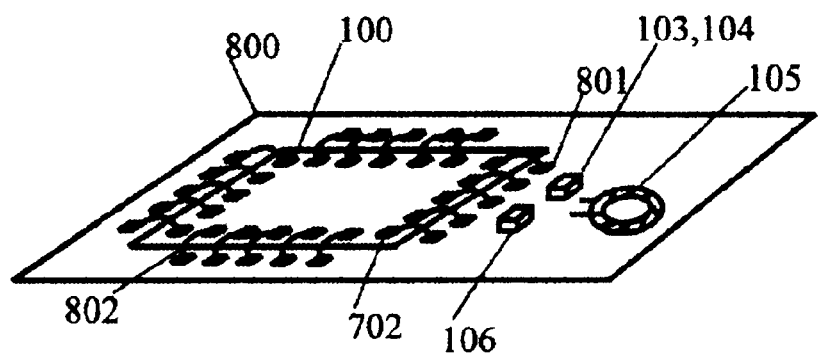
FIG. 8 illustrates a perspective view of the complete semiconductor die and power supply system integrated by bonding upon a common substrate.

FIG. 7 and FIG. 8 render a perspective view of a physical embodiment of the previously described design example within the scope of the present invention. Power supply substrate 703 and likewise substrate 800 may consist of a ceramic material, an organic material such as polytetrafluoroethylene material, or most commonly a fiberglass resin epoxy based laminate material such as FR4. In FIG. 7, the power supply substrate 703 and the semiconductor die 100 sit adjacent to each other within the periphery of a lead frame 700 for assembly within a leaded package. In FIG. 8, the power supply components are mounted on the same substrate 800 as the semiconductor die 100, the practice of mounting a semiconductor die directly to a substrate as such being common to Ball Grid Array packages of prior art. In both of these two exemplary embodiments, the toroid core inductor 105, the package containing the power switching transistors 103, 104, and the output capacitor 106 are first mounted to the substrate. In any of the methods within the scope of the present invention, once these components are mounted to the substrate, the substrate may be probe tested at various load currents and duty cycles corresponding to the power states of the semiconductor die 100, and then trimmed according to any of the previously described output voltage offset adjusting systems or methods. According to the embodiment of FIG. 7, the bonding pads of the power supply substrate 703 and the semiconductor die 100 are then first affixed to the lead frame 700 by bonding wires 706 and 708, respectively, attaching to lead frame bonding pads 707 and 701, respectively, and then interstitial bonding wires 704 attach the bonding pads 702 of the semiconductor die 100 to the bonding pads 705 of the power supply substrate 703. The present invention places no restriction upon the signal types conducted via the interstitial bonding wires 704, they may conduct any of the power supply specific signals or also simply any signals conveniently routed to the side of semiconductor die 100 in the location of bonding pads 702, across the interstitial bonding wires 704, and routed directly from bonding pads 705 across the power supply substrate 703 to the power supply substrate pads nearest the lead frame bonding pads 707. After affixing all of the interstitial bonding wires 704, the device may then be sealed with an epoxy in a ceramic body or molded in a plastic body and undergo final test. In FIG. 8, as with the embodiment of FIG. 7, once the supply components 103, 104, 105, 106 have been mounted and optionally tested and trimmed, bonding wires 802 affix the semiconductor die 100 to the substrate 800 and permit electrical and perhaps heat conduction from the bonding pads 702 of the semiconductor die 100 to the bonding pads 801 of the substrate 800. The top surface of the substrate 800 may then be sealed with an epoxy or molded over with a plastic body and undergo final test. In the case of a Ball Grid Array package, the bottom surface of the substrate 800 contains pads that in the final step have solder balls attached.

From the preceding description of the present invention it is manifest that various techniques can be used for implementing the concepts of the present invention without departing from its scope. Furthermore, while the invention has been described with specific reference to certain embodiments, a person of ordinary skill in the art would recognize that changes could be made in form and detail without departing from the scope and the spirit of the invention. The described embodiments have been presented in all respects as illustrative and not restrictive. It should also be understood that the invention is not limited to the previously described particular embodiments, but is capable of many rearrangements, modifications, omissions, and substitutions without departing from the scope of the invention.

Thus, a system and method for integrating a digital core with a switch mode power supply has been described.

What is claimed is:

1. An integrated circuit package comprising:
a semiconductor die of plural separate power supply voltage domains; and
a switch mode DC-to-DC converter,
wherein said switch mode DC-to-DC converter comprises:
an inductor core and windings;
a power switching transistor; and
an output voltage fixing circuit comprising digital open-loop means requiring no feed-forward loop and no feedback loop.

2. An integrated circuit package comprising:
a semiconductor die of plural separate power supply voltage domains; and
a switch mode DC-to-DC converter,
wherein said switch mode DC-to-DC converter comprises:
an inductor core and windings;
a power switching transistor; and
an output voltage fixing circuit,
wherein said semiconductor die comprises a decoder that compares an entry from a table corresponding to the present power state of said semiconductor die to a clock counter frequency divider output to determine duty cycle and/or switching frequency of said power switching transistor for said output voltage fixing circuit.

3. The integrated circuit of claim 2, wherein said table of entries of clock counter values to determine duty cycle is encoded within logic within said semiconductor die.

4. The integrated circuit of claim 2, wherein said table of entries of clock counter values to determine duty cycle is contained within non-volatile memory.

5. The integrated circuit package of claim 2, wherein the power transistor gate-driving signal output from said semiconductor die is connected through a charge pump circuit to optimize efficiency of the power switching transistor of said DC-to-DC converter.

6. The integrated circuit package of claim 2, further comprising a substrate of fiberglass resin epoxy of type FR4 based laminate material for mounting said DC-to-DC converter components.

7. The integrated circuit package of claim 6, wherein said semiconductor die further comprises a plurality of pads from which to accept a binary number offset for fine tuning said duty cycle and/or switching frequency by modifying the value compared to the clock counter frequency divider in said output voltage fixing circuit of said DC-to-DC converter.

8. The output voltage fixing circuit of claim 7, wherein said binary number offset is embodied within fusible leads on said substrate that are electrically or mechanically trimmed or laser-trimmed at the factory.

9. The output voltage fixing circuit of claim 7, wherein said binary number offset is embodied within a wire-bonding option during assembly of said semiconductor die pads to the lead frame of said integrated circuit package.

10. The integrated circuit package of claim 6, wherein the power transistor gate driving signal output from said semiconductor die is connected through a trimmed delay circuit to fine tune the duty cycle of pulse width modulator or pulse frequency modulator of the output voltage fixing circuit of said DC-to-DC converter.

11. The output voltage fixing circuit of claim 10, wherein said trimmed delay circuit further comprises a printed film resistor on the substrate that is laser-trimmed at the factory.

12. An integrated circuit package comprising a substrate of fiberglass resin epoxy of type FR4 g based laminate material for mounting:

a semiconductor die of plural separate power supply voltage domains; and a switch mode DC-to-DC converter further comprising an inductor core and windings, a power switching transistor and an output voltage fixing circuit comprising digital open-loop means requiring no feed-forward loop and no feedback loop.

13. The output voltage fixing circuit of claim 7, wherein said binary number offset is embodied within a wire-bonding option during assembly of said semiconductor die pads onto a substrate of fiberglass resin epoxy of type FR4 based laminate material.

14. A method for design and fabrication of an integrated circuit package comprising a semiconductor die of plural separate power supply voltage domains with an integrated switch mode power supply, said method comprising steps of:

designing a semi-custom or standard cell library based digital core and obtaining from the design automation tools power consumption estimates in various power states given known clocking rates;

determining switch mode power supply frequency, inductance, and duty cycles for various power states given said power consumption estimates and system clocking;

fabricating said semiconductor die for prototyping purposes, packaged without said integrated switch mode power supply;

characterizing said prototype semiconductor die for power consumption over all operating power states and environmental conditions and process variations;

fabricating said switch mode power supply onto final production substrates;

trimming the output voltage fixing circuit of said switch mode power supply after a probe test to determine the output voltages at given duty cycles versus output currents defined by said semiconductor die known characterization data;

bonding and molding or sealing with epoxy said semiconductor die and power supply substrate into an integrated package.

15. The method of claim 14, wherein said step of trimming the output voltage fixing circuit further comprises a step of binning said final production power supply substrates into the appropriate wire-bonding assembly line to set the proper binary number offset of the output voltage fixing circuit.

16. The method of claim 14, wherein said step of trimming the output voltage fixing circuit further comprises a step of breaking fusible leads on said final production power supply substrate to set the binary number offset of the output voltage fixing circuit.

17. The method of claim 14, wherein said step of trimming the output voltage fixing circuit further comprises a step of laser trimming a printed film resistor forming a delay circuit of the output voltage fixing circuit on said final power supply substrate.

18. The method of claim 14, wherein said step of trimming the output voltage fixing circuit further comprises a step of programming a non-volatile memory with entries of clock counter values to determine duty cycle and/or switching frequency corresponding to each power state of the semiconductor die.

19. A method for design and fabrication of an integrated circuit package comprising a semiconductor die of plural separate power supply voltage domains with an integrated switch mode power supply, said method comprising steps of:

designing a semi-custom or standard cell library based digital core and obtaining from the design automation tools power consumption estimates in various power states given known clocking rates;

determining switch mode power supply frequency, inductance, and duty cycles for various power states given said power consumption estimates and system clocking;

fabricating said semiconductor die for prototyping purposes, packaged without said integrated switch mode power supply;

characterizing said prototype semiconductor die for power consumption over all operating power states and environmental conditions and process variations;

fabricating said switch mode power supply onto final production substrates;

bonding and molding or sealing with epoxy said semiconductor die and assembled final power supply substrate into an integrated package.

* * * * *